United States Patent
Kiss et al.

(10) Patent No.: US 6,888,484 B2
(45) Date of Patent: May 3, 2005

(54) STABLE HIGH-ORDER DELTA-SIGMA ERROR FEEDBACK MODULATORS, AND NOISE TRANSFER FUNCTIONS FOR USE IN SUCH MODULATORS

(75) Inventors: Peter Kiss, Morristown, NJ (US); Jesus Arias, Valladolid (ES); Dandan Li, San Diego, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/851,790

(22) Filed: May 21, 2004

(65) Prior Publication Data

US 2004/0233086 A1 Nov. 25, 2004

Related U.S. Application Data

(60) Provisional application No. 60/472,488, filed on May 22, 2003.

(51) Int. Cl.[7] ............................................. H03M 3/00
(52) U.S. Cl. ..................................... 341/143; 341/144
(58) Field of Search ................................. 341/143–144

(56) References Cited

U.S. PATENT DOCUMENTS

| | | | | |
|---|---|---|---|---|
| 3,843,940 A | * | 10/1974 | Ishiguro et al. | 375/245 |
| 4,467,316 A | * | 8/1984 | Musmann et al. | 341/144 |
| 2003/0216906 A1 | * | 11/2003 | Norsworthy | 704/10 |

OTHER PUBLICATIONS

Willingham, Scott, Perrott, Michael, Setterberg, Brian, Grzegorek, Andrew and McFarland, Bill, "An Integrated 2.5GHzΣΔσ Frequency Synthesizer with 5 μ s Setting and 2MB/s Closed Loop Modulation," *2000 IEEE Journal of Solid–State Circuits Conference*, pp. 200–201 (Feb. 2000).

Filiol, Norman M., Riley, Thomas A. D., Plett, Calvin and Copeland, Miles A., "An Agile ISM Brand Frequency Synthesizer with Built–In GMSK Data Modulation," *IEEE Journal Of Solid–State Circuits*, vol. 33, No. 7, pp. 998–1008 (Jul. 1998).

Norsworthy, Steven R., "Optimal Nonrecursive Noise Shaping Filters for Oversampling Data Converters: Part 1: Theory," *Proc. IEEE Int. Symp. Circuits Syst.*, pp. 1353–1356 (May 1993).

Schreier, Richard, Yang, Yaohua, "Stability Tests for Single–Bit Sigma–Delta Modulators with Second–Order FIR Noise Transfer Functions," *Proc. IEEE Int. Symp. Circuits Syst.*, pp. 1316–1319 (May 1992).

* cited by examiner

Primary Examiner—Michael Tokar
Assistant Examiner—Khai Nguyen

(57) ABSTRACT

Stable, robust, and high-resolution delta-sigma error feedback modulators, such as those used in digital-to-analog converters and phase-locked loops, include an L-order noise transfer function that is provided with L+1 high-order bits from a truncation element. The stability of such delta-sigma error feedback modulators is independent of the input signal. Moreover, the out-of-band gain of the noise transfer function need not be limited, which improves the resolution and the signal-to-noise ratio of the in-band signal.

34 Claims, 8 Drawing Sheets

STABLE HIGH-ORDER DELTA-SIGMA ERROR FEEDBACK MODULATORS, AND NOISE TRANSFER FUNCTIONS FOR USE IN SUCH MODULATORS

§ 0. PRIORITY CLAIM

Benefit is claimed, under 35 U.S.C. § 119(e)(1), to the filing date of provisional patent application Ser. No. 60/472,488, titled "STABLE HIGH-ORDER DELTA-SIGMA MODULATORS," filed on May 22, 2003 and listing Peter Kiss, Jesus Arias and Dandan Li as the inventors, for any inventions disclosed in the manner provided by 35 U.S.C. § 112, ±1. This provisional application is expressly incorporated herein by reference. The present invention is not limited to any requirements of any of the exemplary embodiments described in the provisional application.

§ 1. BACKGROUND

§ 1.1 Field of the Invention

The present invention concerns delta-sigma error feedback ($\Delta\Sigma$ EF) modulators. More specifically, the present invention concerns noise transfer functions (NTFs) in $\Delta\Sigma$ EF modulators, particularly in $\Delta\Sigma$ EF modulators used in digital-to-analog converters (DACs) and phase-locked loops (PLLs).

§ 1.2 Background Information

Delta-sigma ($\Delta\Sigma$) modulators are introduced in § 1.2.1 below. Then, the use of $\Delta\Sigma$ EF modulators in digital-to-analog converters (DACs) and phase-locked loops (PLLs) is introduced in § 1.2.2. Finally, challenges to designing well-performing $\Delta\Sigma$ EF modulators are discussed in § 1.2.3.

§ 1.2.1 $\Delta\Sigma$ Modulators

Data converters, such as DACs using $\Delta\Sigma$ modulators for example, have been used as building blocks in mixed signal chips (i.e., those with both analog and digital circuits). As shown in FIG. 1, a $\Delta\Sigma$ EF modulator 100 includes a first mixer (e.g., an adder) 120, a truncation element 110, a second mixer 140 and a noise transfer function (NTF) element 130 (Although H(z)=1−NTF, "NTF" may be used for brevity.). The first mixer 120 includes a first input 122 for accepting an input signal, a second input 124 coupled with an output of the NTF element 130, and an output 126 coupled with an input of the truncation element 120. The output 112 of the truncation element 110 is provided as an output. The second mixer 140 includes a first input coupled with the output 126 of the first mixer 120, a second input coupled with the output 112 of the truncation element 110, and an output 142 coupled with an input of the NTF element 130. The second mixer 140 subtracts higher order bits 112 from the bits 126 to provide lower order bits 142 as its output. The truncation element 110 reduces the number of bits in the input signal. Also, the $\Delta\Sigma$ modulator uses oversampling. The NTF element 130 may be used to perform truncation (i.e., quantization) error shaping.

The design of a $\Delta\Sigma$ modulator may involve trade-offs between speed and resolution, and analog circuit accuracy and digital circuit complexity. One possible way to obtain a high-resolution and high-speed $\Delta\Sigma$ analog-to-digital converter (ADC) or DAC is to use a high-order and/or multi-bit modulator. High-order quantization error shaping can be achieved by either single-loop or multi-loop (i.e., cascaded or MASH) architectures. (See, e.g., S. R. Norsworthy, R. Schreier, and G. C. Temes, Eds., *Delta-Sigma Data Converters: Theory, Design, and Simulation*. NY: IEEE Press, 1996, incorporated herein by reference and hereafter referred to as "the Norsworthy text".)

The choice of the quantization error or quantization noise transfer function (NTF) plays a significant role in the achievable performance of the modulator. While the in-band attenuation of the NTF is provided by its zeros, the out-of-band gain (OBG) of the NTF is controlled by its poles. Reducing the OBG improves the loop's stability, but increases the in-band noise, thereby worsening the signal-to-noise ratio (SNR) of the modulator. For high-order loops (i.e., larger than one), it is possible to gain more performance by moving the zeros out of the NTF from DC, and arranging them in the signal band to provide maximal noise suppression for a given oversampling ratio (OSR). (See, e.g., R. Schreier, "An empirical study of high-order single-bit delta-sigma modulators," *IEEE Trans. Circuits Syst. II*, vol. 40, no. 8, pp. 461–466, August 1993, incorporated herein by reference and hereafter referred to as "the Schreier I article".) Also, high-order modulators are prone to become unstable for large input signals. (See, e.g., the Norsworthy text, chapters 4–5.)

The fact that the truncation element (or quantizer) 110 is nonlinear makes a stability analysis of high-order loops a challenge. "Unstable" means that the modulator exhibits large, although not necessarily unbounded, states and a poor SNR compared to those predicted by linear models. (See, e.g., the Norsworthy text, section 4.1.)

§ 1.2.1.1 Output Feedback $\Delta\Sigma$ Modulators

So called "output-feedback" (OF) modulators are popular. OF modulators used for delta-sigma ADCs and DACs (See, e.g., FIG. 2.) may include a chain of integrators or accumulators with feedback or feed-forward summation, respectively. Presently, to ensure stability, a conservative empirical rule (See, e.g., W. L. Lee, "A novel higher-order interpolative modulator topology for high resolution oversampling A/D converters," Master's thesis, Massachusetts Institute of Technology, Cambridge, Mass., June 1987, incorporated herein by reference and hereafter referred to as "the Lee article".) and/or a root-locus method (See, e.g., T. Ritoniemi, T. Karema, and H. Tenhunen, "The design of stable high-order 1-bit sigma-delta modulators," in *Proc. IEEE Int. Symp. Circuits Syst.*, May 1990, pp. 3267–3270, incorporated herein by reference and hereafter referred to as "the Ritoniemi article".) may be used, along with extensive simulations. The empirical rule provided in the Lee article is applicable for single-bit modulators. It requires an OBG of the NTF to be less than 1.5. For multi-bit, high-order, modulator designs, a more relaxed value (e.g., less than 3.5) for the OBG of the NTF is sufficient for stability. (See, e.g., W. Rhee, A. Ali, and B. Song, "A 1.1 GHz CMOS fractional-N frequency synthesizer with a 3b 3rd-order delta-sigma modulator," in *Dig. IEEE Int. Solid-State Circuits Conf.*, February 2000, pp. 198–199, incorporated by reference and hereafter referred to as "the Rhee article".) The reduction of OBG is implemented in the NTF element.

Unfortunately, the existing techniques for ensuring stability have at least two non-trivial drawbacks. First, they drastically limit the achievable performance of single-loop high-order modulators. More specifically, reducing OBG increases in-band noise and, thus, reduces resolution. Second, precaution and lengthy simulations are necessary, when designing the NTF used by the H(z) element, to ensure stability of the modulator.

§ 1.2.1.2 Error Feedback $\Delta\Sigma$ Modulators

Error-feedback (EF) modulators are widely used in $\Delta\Sigma$ DACs (See, e.g., the Norsworthy text; H. G. Musmann and W. Korte, "Generalized interpolative method for digital/analog conversion of PCM signals," U.S. Pat. No. 4,467,316, Aug. 21, 1984, incorporated herein by reference and hereafter referred to as "the Musmann patent"; and P. J. Naus, E. C. Dijkmans, E. F. Stikvoort, A. J. McKnight, D. J. Holland, and W. Bradinal, "A CMOS stereo 16-bit D/A converter for digital audio," *IEEE J. Solid-State Circuits*, vol. 22, no. 3, pp. 390–395, June 1987, incorporated herein by reference and hereafter referred to as "the Naus article.") and fractional-N PLLs (See, e.g., S. Willingham, M. Perrott, B. Setterberg, A. Grzegorek, and B. McFarland, "An integrated 2.5 GHz delta-sigma frequency synthesizer with $5^1$s settling and 2 Mb/s closed loop modulation," in *Dig. IEEE Int. Solid-State Circuits Conf.*, February 2000, pp. 200–201, incorporated herein by reference and hereafter referred to as "the Willingham article.").

FIG. 3A is a block diagram of a DAC 300 including $\Delta\Sigma$ EF modulator 390, such as the one 100 illustrated in FIG. 1, and an analog DAC 350. The $\Delta\Sigma$ EF modulator 390 is used to shape quantization (i.e., truncation) noise. It may be desired to have the analog DAC 350 process less bits so that (i) a more simple circuit may be used, and/or (ii) the analog DAC 350 has better linearity (with respect to frequency). Like the EF modulator 100 of FIG. 1, the EF modulator 390 includes a first mixing element 320, a truncation element 310, a second mixing element 340 and an NTF element 330.

§ 1.2.1.3 Challenges in Designing Well-Performing $\Delta\Sigma$ EF Modulators For high-order NTF elements (e.g., loop filters), internal limiters are often used to protect the overflow of the internal signals. (See, e.g., the Naus article.) Also, the stability of the design is generally carefully verified by extensive simulations.

A sufficient stability test for EF modulators based on the L-norm of the impulse response of a loop filter h(t) was proposed. (See, e.g., R. Schreier and Y. Yang, "Stability tests for single-bit sigma-delta modulators with second-order FIR noise transfer functions," in *Proc. IEEE Int. Symp. Circuits Syst.*, May 1992, pp. 1316–1319, incorporated herein by reference and hereafter referred to as "the Schreier II article".) The Schreier II article discusses keeping the delta-sigma loop stable, particularly for a single-bit case with a second order NTF. This L-norm test of the Schreier II article was extended to include dither signal as well. (See, e.g., S. R. Norsworthy, "Optimal nonrecursive noise shaping filters for oversampling data converters. Part 1: Theory," in *Proc. IEEE Int. Symp. Circuits Syst.*, May 1993, pp. 1353–1356, incorporated herein by reference and hereafter referred to as "the Norsworthy article"; See also section 3.14.1 of the Norsworthy text.) Unfortunately, however, these techniques require that the input signal be constrained to a small or bounded signal.

§ 1.2.1.4 Perceived Needs

In view of the foregoing, stable $\Delta\Sigma$ modulators are needed. It might be beneficial if such $\Delta\Sigma$ modulators could be provided with a larger, or unbounded input signal. It might be beneficial if techniques for ensuring stability did not come at the expense of in-band noise and resolution, such as occurs when reducing OBG. It might be beneficial to provide a stable $\Delta\Sigma$ modulator with a higher order NTF. In summary, better $\Delta\Sigma$ modulators would be useful, and could be used to improve devices that use $\Delta\Sigma$ modulators such as DACs and PLLs for example.

§ 2. SUMMARY OF THE INVENTION

Consistent with the present invention, the stability of $\Delta\Sigma$ EF modulators, such as those used in digital-to-analog converters and phase-locked loops, can be ensured by including an L-order noise transfer function (NTF) provided with L+1 high-order bits from a truncation element. The stability of such $\Delta\Sigma$ EF modulators is independent of the input signal.

In at least some embodiments consistent with the present invention, the out-of-band gain of the NTF is not limited.

In at least some embodiments consistent with the present invention, the L is at least four. In at least some embodiments consistent with the present invention, L is 4 or 5.

§ 3. BRIEF DESCRIPTION OF THE DRAWINGS

Figure 8:
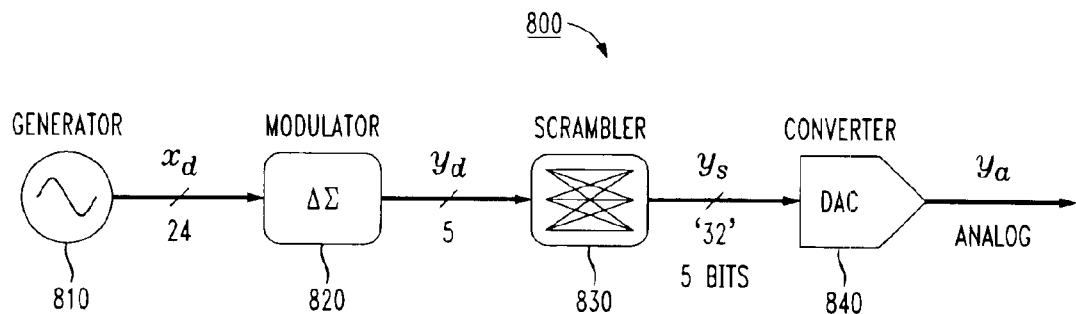
FIG. 8 is a block diagram of an experimental $4^{th}$ order, 5-bit $\Delta\Sigma$ EF DAC, consistent with the present invention.
Figure 9:
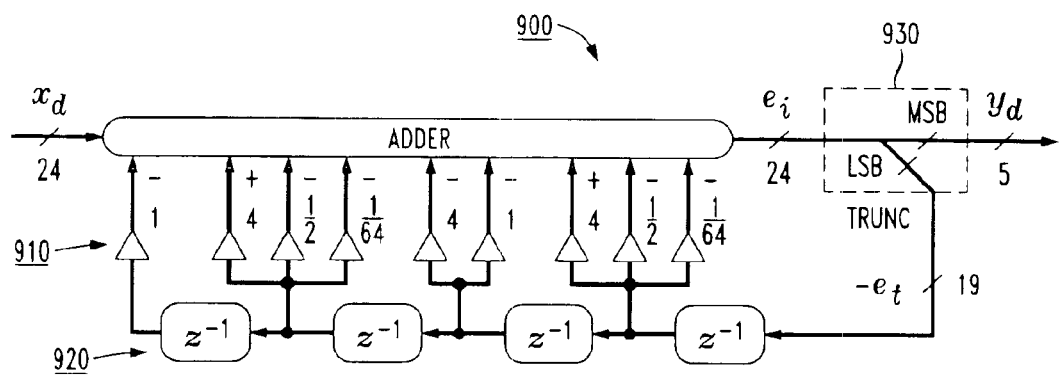
FIG. 9 is a block diagram of an exemplary $\Delta\Sigma$ EF modulator that may be used in the $\Delta\Sigma$ EF DAC of FIG. 8.
Figure 10:
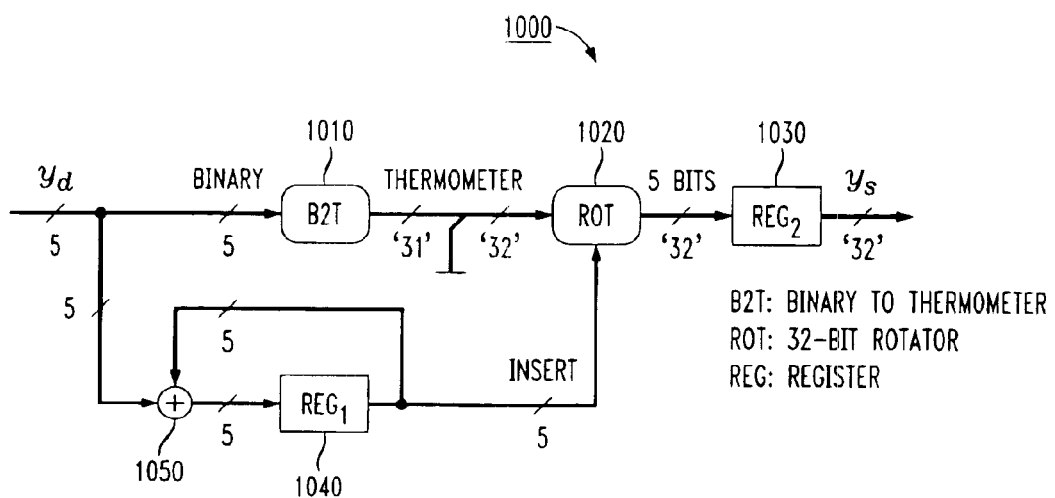
FIG. 10 is a schematic of an exemplary scrambler that may be used in the $\Delta\Sigma$ EF DAC of FIG. 8.
Figure 12A:
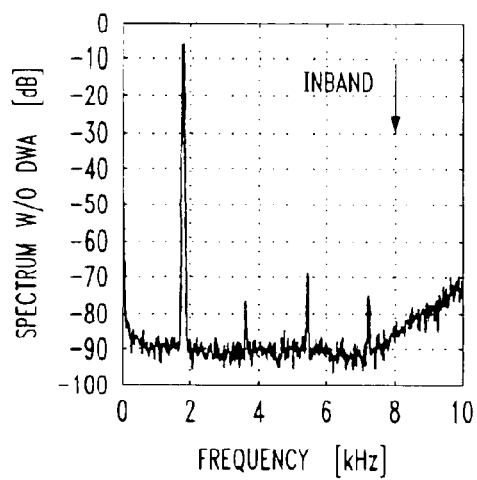
Figure 12B:
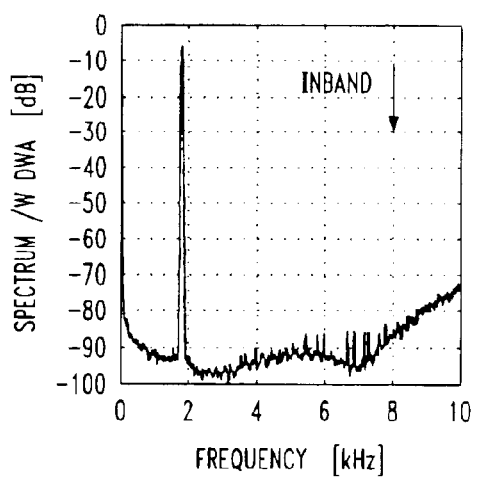
Figure 12C:
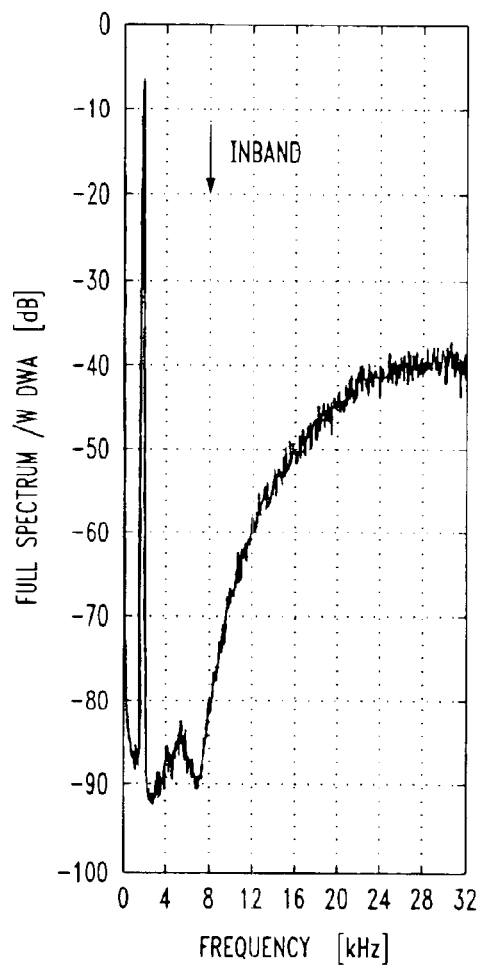

FIGS. 12*a* and 12*b* are graphs of the measured spectra of a $4^{th}$ order, 5-bit $\Delta\Sigma$ EF modulator for OSR=4, such as the those illustrated in FIGS. 8–10, without a DWA scrambler, in which the SNDR=58.7 dB, and with a DWA scrambler, in which the SNDR=64.1 dB. FIG. 12*c* is a full spectrum version of the device measured in FIG. 12*b*, but with an increased resolution bandwidth.

§ 4. DETAILED DESCRIPTION OF THE INVENTION

The present invention may involve novel methods and/or apparatus for providing stable $\Delta\Sigma$ EF modulators. The following description is presented to enable one skilled in the art to make and use the invention, and is provided in the context of particular applications and their requirements. Thus, the following description of embodiments consistent with the present invention provides illustration and description, but is not intended to be exhaustive or to limit the present invention to the precise form disclosed. Various modifications to the disclosed embodiments will be apparent to those skilled in the art, and the general principles set forth below may be applied to other embodiments and applications. For example, although a series of acts may be described, the order of acts may differ in other implementations when the performance of one act is not dependent on the completion of another act. Further, non-dependent acts may be performed in parallel. No element, act or instruction used in the description should be construed as critical or essential to the present invention unless explicitly described as such. Also, as used herein, the article "a" is intended to include one or more items. Where only one item is intended, the term "one" or similar language is used. Thus, the present invention is not intended to be limited to the embodiments shown and the inventors regard their invention as any patentable subject matter described.

§ 4.1 Exemplary Noise Transfer Functions for ΔΣ EF Modulators

Figure 3A:
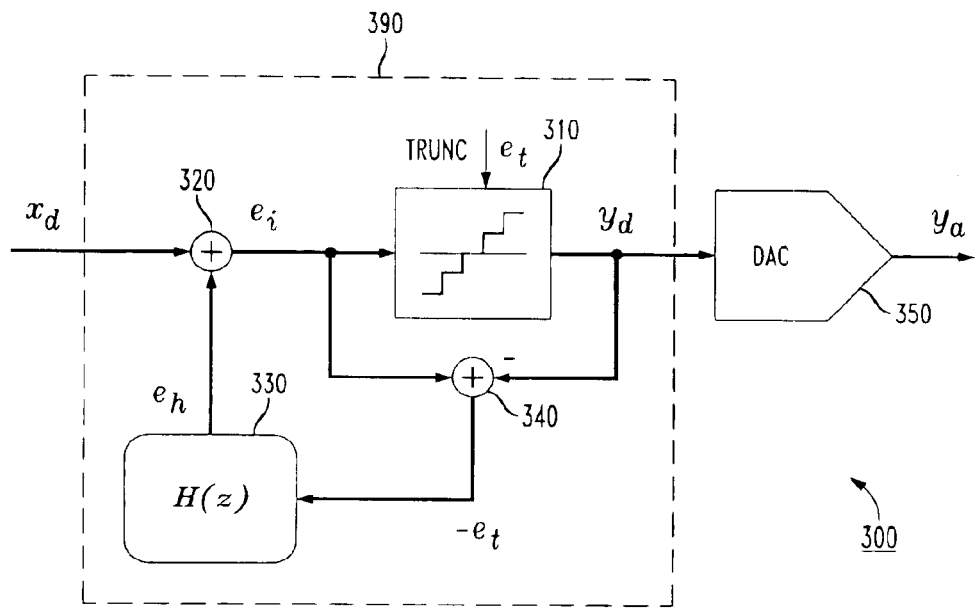
FIGS. 3A and 3B are block and functional diagrams, respectively, of an exemplary $\Delta\Sigma$ EF DAC consistent with the present invention.

Referring back to the block diagram of FIG. 3A, the truncation element 310 provides the most-significant bits $y_d$ (MSBs) of the input for the following DAC 350. The mixer 340 removes the MSBs from the input, and feeds the least-significant bits (LSBs) to the NTF element (e.g., digital loop filter H(z)) 330. The fact that the LSBs are provided to the NTF element 330 is illustrated in the simplified functional diagram of FIG. 3B. Using the additive white-noise model (See, e.g., Section 2.3 of the Norsworthy text.) for the truncation element 310, the delta-sigma modulator can be described by a linearized model. According to this linearized model the output $y_d$ of the truncation element 310 may be represented as:

$$y_d(z)=x_d(z)+(1-H(z))e_t(z)=STF(z)x_d(z)+NTF(z)e_t(z), \quad (1)$$

where STF(z)=1 is the signal transfer function and NTF(z) 1−H(z) is the truncation error (or truncation noise) transfer function.

When NTF(z) is a finite impulse response (FIR) transfer function, H(z) is also an FIR function for ΔΣ EF modulators. (See equation (1).) Consequently, there is no accumulation in H(z) as opposed to the case of OF topologies. The only accumulation occurs during the addition at the input node, but this is directly followed by the truncation operation. Therefore, the bit length of every internal signal can be accurately predicted analytically without the need of numerical analysis.

Figure 3B:
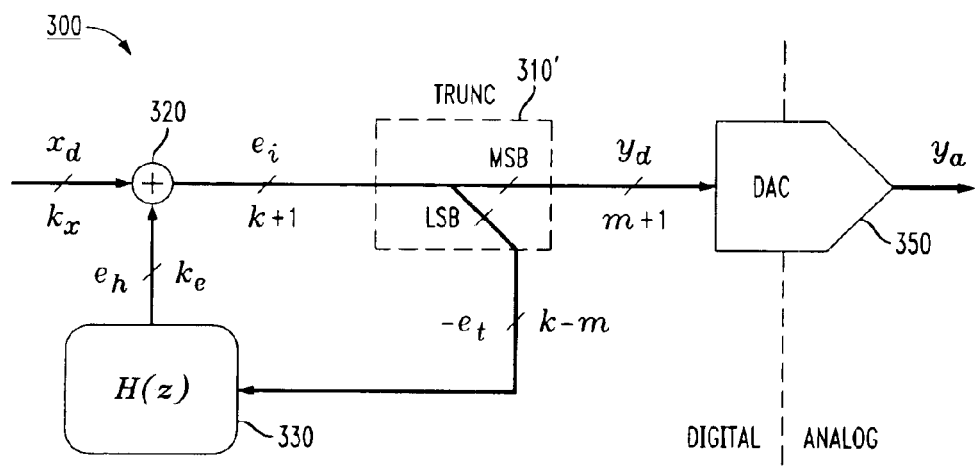

Referring to FIG. 3B, assume, for example, that the NTF element 330 is an FIR loop filter H(z) that adds m bits to the bit length. The input summation 320 adds one more bit at most. To keep all internal signals bounded, whatever enters the loop also needs to exit. Accordingly, $y_d$ should have m+1 bits at least (i.e., 'm' due to H(z), and '1' due to the input summation). By notation the input $x_d$ has $k_x$ bits and the feedback $e_h$ has $k_e$ bits. If $k_e \leq k_x$ holds, which is a valid initial condition, and $y_d$ is kept to its minimal value of m+1, then $e_t$ will have $k_x+1$ bits at most, and $k_x-m$ LSBs will be fed back to the loop. This leads to $e_h$ of $k_x$ bits. Therefore, $k_x=k_e=k$ holds for steady state, and all internal signals are bounded as shown in FIG. 3B. Note that k>m for practical reasons, so k−m will not become negative. In other words, consistent with the present invention, a sufficient stability criterion for a ΔΣ EF modulator can be expressed as follows: an EF modulator with a truncator of m+1 bits and an FIR loop filter H(z), which contributes to a m-bit increase in the dataflow, is stable.

To achieve low truncation error energy in the low-frequency signal band, NTF(z) should have high-pass characteristics. For example, an $L^{th}$ order differentiator $(1-z_{-1})^L$ may be chosen as NTF(z). L also determines the order of the delta-sigma loop. All the zeros of this FIR NTF(z) reside at DC. Therefore, OBG is $2^L$, which is the maximum possible OBG value for an $L^{th}$ order modulator. When optimized zeros are used in an FIR NTF(z), the OBG stays about $2^L$, only slightly smaller. Consistent with the present invention, the sufficient stability criterion is also applicable if an infinite impulse response (IIR) NTF(z) is used.

In comparison, recall from § 1.2.1.1 above that OF modulators require a much smaller OBG value (e.g., 3.5) for stability. Therefore, finite-valued poles were added to NTF (z) in OF modulators, transforming it into an IIR filter.

The foregoing discussion treats the truncator as a realistic, truly nonlinear circuit, so it does not rely on any simplifying assumption of the additive white-noise model used in equation (1). Also, note that the foregoing is a sufficient analytical criterion, though not necessarily both necessary and sufficient criterion. That is, although using L+1 bits in the truncator is sufficient to keep all internal signals bounded, thereby keeping the high-order loop stable, it is conservative.

§ 4.1.1 Exemplary Stable EF Modulators Consistent with the Present Invention As a first example, consider a $L^{th}$ order EF loop with NTF(z)=$(1-z^{-1})^L$ and H(z)=1−NTF(z). In the worst case scenario, a ±1 alternating sequence applied to $(1-z^{-1})^L$ leads to $2^L$ (i.e., to an L-bit output). Therefore, H(z) contributes less than L bits to the dataflow. In other words, the lowest value for m is L, so if $y_d$ has m+1=L+1 bits, then all internal signals are bounded, i.e., the $L^{th}$ order loop is stable. In the case of a $4^{th}$ order loop with NTF(z)=$(1-z^{-1})^4$ and H(z)=$z^{-1}$ $(4-6z^{-1}+4z^{-2}-z^{-3})$, it turns out that m is 4, and $y_d$ has 5 bits according to the criterion described here:

DC-zeroed FIR NTF(z)=$(1-z^{-1})^L$ and H(z)=1−NTF(z)

m≤L⇒if $y_d$ has L+1 bits →stable ΔΣ

For L=4:

NTF(z)=$(1-z^{-1})^4$=$(1-2z^{-1}+z^{-2})\cdot(1-2z^{-1}+z^{-2})$ and H(z)=$z^{-1}(4-6z^{-1}+4z^{-2}-z^{-3})$ m≤4⇒if $y_d$ has 5 bits→stable ΔΣ.

This first exemplary ΔΣ EF modulator is hardware efficient.

As a second example, consider an $L^{th}$ order EF loop with an optimized-zeroed FIR NTF(z). Since the zeroes stay inside the unit circle, the contribution of H(z)=1−NTF(z) does not exceed L bits. In other words, when optimized zeros are used in the NTF(z) of order L, the m-bit contribution of H(z) will always be slightly smaller than L, i.e., m<L (although the values of m and L, rounded to the nearest integer, may be the same). In case of a $4^{th}$ order loop and OSR=8, an NTF(z) of $(1-1.98z^{-1}+z^{-2})$ $(1-1.88z^{-1}+z^{-2})$ results. (See, e.g., the Schreier article.) Again, m is 4 and if $y_d$ has 5 bits, the modulator is stable based on the criterion described here:

optimized-zeroed FIR NTF(z) and H(z)=1−NTF(z)

m≤L⇒if $y_d$ has L+1 bits→stable ΔΣ

For L=4 and OSR=8:

NTF(z)=$(1-1.98z^{-1}+z^{-2})\cdot(1-1.88z^{-1}+z^{-2})$ and H(z)=$z^{-1}(3.86-5.72z^{-1}+3.86z^{-2}-z^{-3})$ m≤4⇒if $y_d$ has 5 bits→4 stable ΔΣ.

This second example is optimized for performance.

§ 4.1.2 Alternatives and Refinements

Again, a ΔΣ EF modulator with $(1-z^{-1})^L$ FIR NTF(z) and L+1 bits is stable. This stable EF modulator has an OBG of $2^L$. In general, reducing OBG improves stability. (See, e.g., Section 5.5 of the Norsworthy text.) Therefore, it is plausible to assume that reducing OBG of this modulator by adding finite-valued poles to its NTF(z) (i.e., turning the initially FIR NTF into an IIR filter) does not worsen its stability. In other words, a stable $L^{th}$ order (L+1)-bit ΔΣ EF modulator is expected for all possible OBG values.

ΔΣ EF DACs consistent with the present invention may require multi-bit digital-to-analog conversion. Since 1-bit DACs are inherently linear, it is usually desired to obtain a single-bit dataflow at the digital output $y_d$. However, highly-linear multi-bit DACs are available (See, e.g., Chap. 8 of the Norsworthy text.). Alternatively, such a high-order modulator may be used in a cascade configuration. (See, e.g., the Musmann patent.)

The choice of the NTF may impact the implementation of the present invention (e.g., as a circuit). For example, the use of optimized zeroes NTF may necessitate expensive multipliers in a digital circuit implementation of H(z), while implementing pure differentiator NTFs are free of multipliers. However, the design example presented in § 4.3 below with reference to FIG. 9 demonstrates that even optimized-zeroed NTFs can be effectively implemented by simple, multiplier-free digital circuits.

4.2 Exemplary Applications for ΔΣ EF Modulators Having a Noise Transfer Function Consistent with the Present Invention ΔΣ EF modulators, consistent with the present invention, may be used in DACs such as those that reduce the number of bits applied to an analog DAC, as illustrated in FIG. 3A. Such ΔΣ EF modulators may also be used in PLLs, such as those described in the Willingham article.

§ 4.3 Characteristics of Simulated and Experimental ΔΣ EF Modulators Consistent with the Present Invention

4.3.1 Simulated ΔΣ EF Modulators

To illustrate the behavior of a high-order ΔΣ EF DAC (FIGS. 3A and 3B), a $4^{th}$ order modulator was simulated in Matlab. The optimized zeroes of the NTF were designed using the toolbox described in R. Schreier, "The delta-sigma toolbox for Matlab," Matlab code and documentation, 1997–2003, available online at <http:==www.mathworks.com=matlabcentral=fileexchange>, and hereafter referred to as "the Matlab ΔΣ toolbox". The z-domain expression of the EF NTF(z) is given by:

$$EF:NTF(z) = \frac{(1 - 1.98z^{-1} + 1.00z^{-2})(1 - 1.88z^{-1} + 1.00z^{-2})}{1}$$

Figure 4:
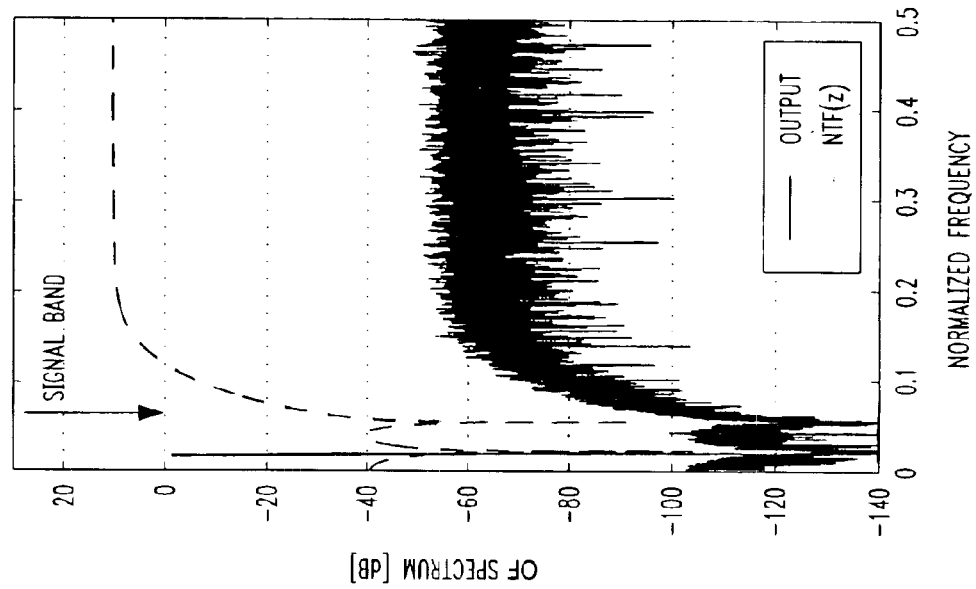
FIG. 4 is a simulated fast Fourier transform (FFT) of a $4^{th}$ order, 5-bit $\Delta\Sigma$ EF modulator for an OSR=8, which shows a SNR of 93.1 dB.

It remained stable for several million samples. A $2^{14}$-point Hann-windowed FFT of the 5-bit output data stream $y_d$ is shown in FIG. 4. The digital input $x_d$ was quantized to $k_x$=24 bits. Since the 5-bit truncation error was aggressively pushed out of band with the $4^{th}$ order FIR NTF, a peak SNR of 93.1 dB was obtained even for a low value of the OSR of 8.

Figure 1:
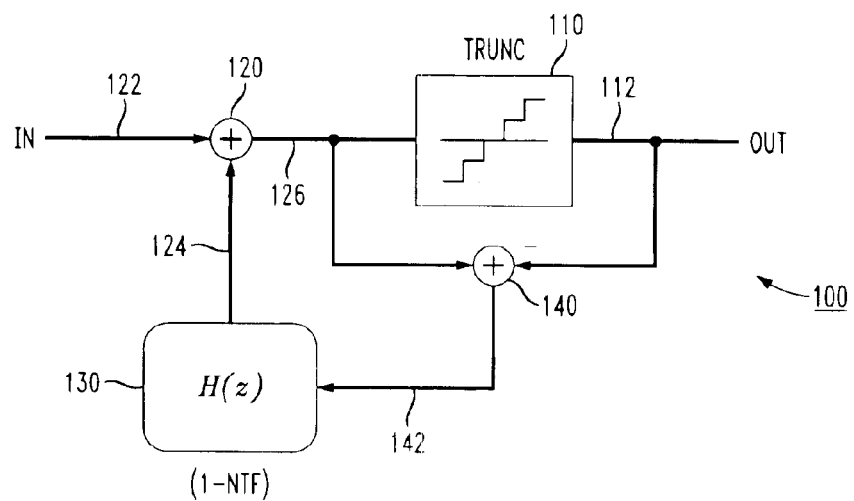
FIG. 1 is a block diagram of an exemplary $\Delta\Sigma$ EF modulator consistent with the present invention.
Figure 2:
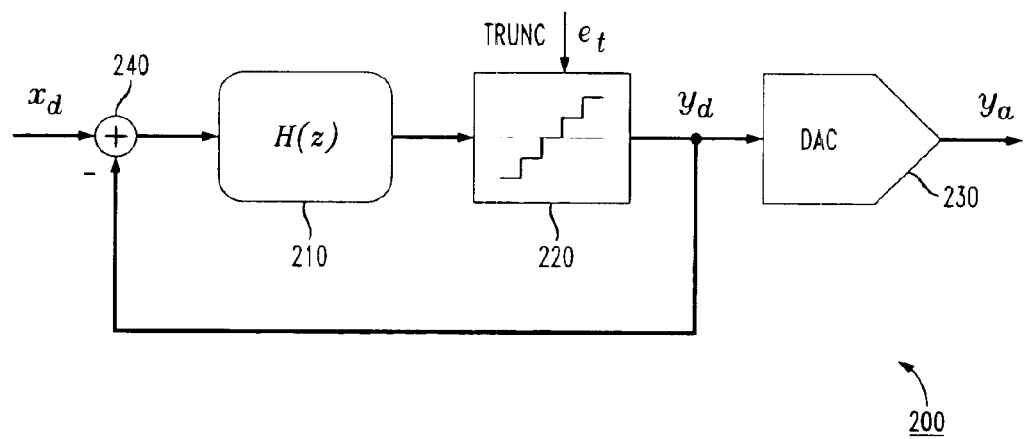
FIG. 2 is a block diagram of an exemplary $\Delta\Sigma$ OF DAC.
Figure 5:
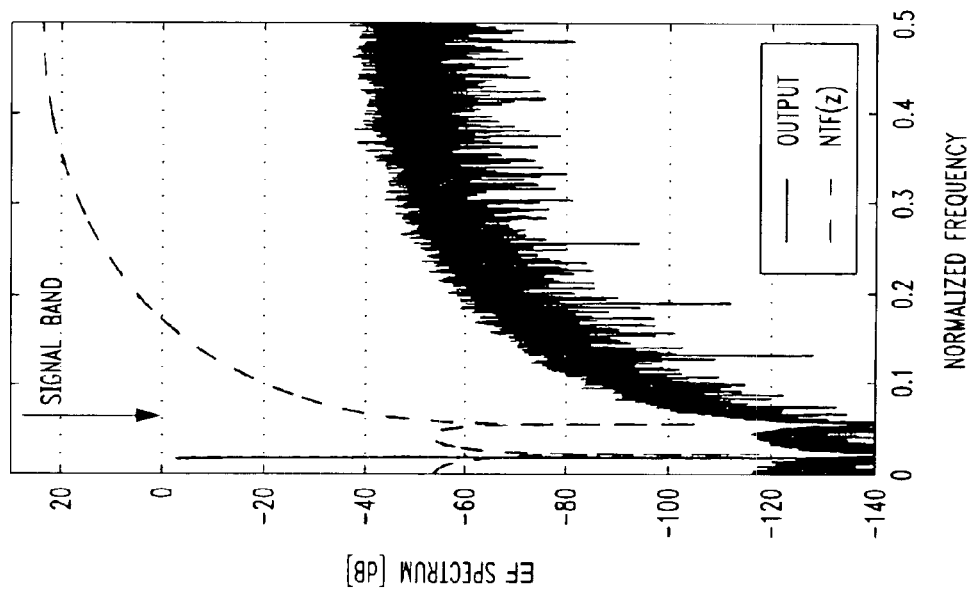
FIG. 5 is a simulated FFT of a $4^{th}$ order, 5-bit $\Delta\Sigma$ OF modulator for an OSR=8, which shows a SNR of 81.2 dB.

For purposes of comparison, FIG. 5 shows the output spectrum of a similar 4th order 5-bit DAC, but designed using an OF topology (Recall FIG. 2.). The OBG of the NTF had to be limited to 3.3 to keep the loop stable. The z-domain expression of the OF NTF(z) is given by:

$$OF:NTF(z) = \frac{(1 - 1.98z^{-1} + 1.00z^{-2})(1 - 1.88z^{-1} + 1.00z^{-2})}{(1 - 0.82z^{-1} + 0.19z^{-2})(1 - 0.88z^{-1} + 0.46z^{-2})}$$

This modulator achieved 81.2 dB peak SNR, about 12 dB lower than the simulated EF architecture.

Figure 6:
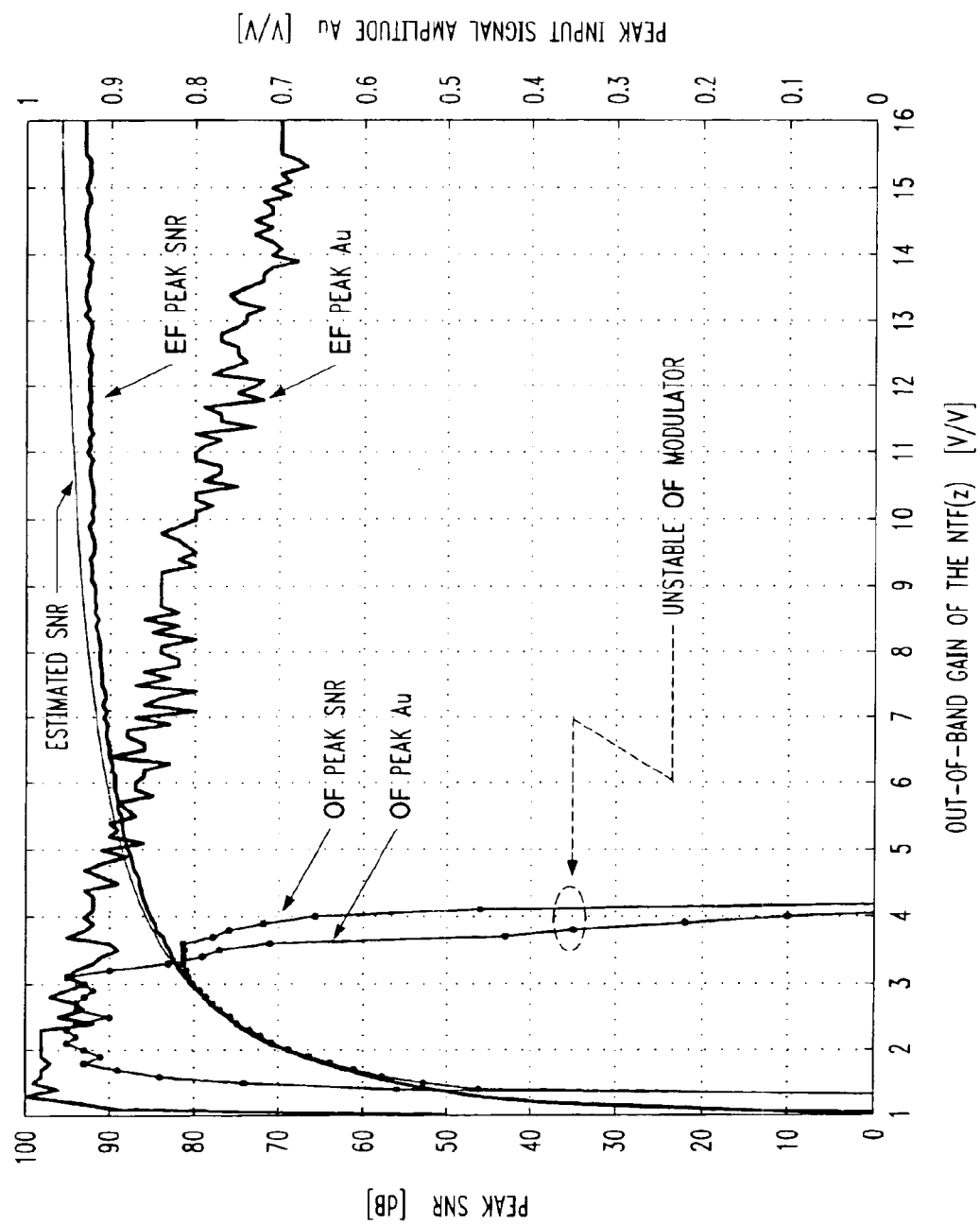
FIG. 6 is a simulated stability test comparing $\Delta\Sigma$ EF and OF modulators.

FIG. 6 compares the achievable performance of two $4^{th}$ order 5-bit optimized-zeroed EF and OF modulators. It shows the peak SNR and the corresponding input signal amplitude $A_u$ as a function of OBG. As shown, the OF modulator's performance abruptly drops when OBG>3.6. The graph indicates that such an OF system cannot sustain stable operation for OBG>4.1 at all. Note that high OBG OF modulators become unstable if the input signal includes sharp transitions. Even if the input signal is band-limited, the OF modulator can become unstable during start-up and it might not recover.

On the other hand, the EF modulator remains stable for the whole possible range of OBG with a small decrease of the available input range to about 0.7 V/V (normalized to full scale) as shown. EF modulators are insensitive to sharp transitions in the input signal and to start-up conditions. The best SNR scenarios for these two $4^{th}$ order 5-bit optimized-zeroed EF and OF modulators were shown in FIGS. 4 and 5, respectively.

The above described stability experiment was performed for a wide range of OSRs, loop orders (L), and corresponding number of bits (N=L+1). It was confirmed that the EF modulator remains stable for large input signals ($A_u$>0.5 V/V) for the whole range of OBG=1 . . . $2^L$. The EF modulator achieved the best performance for OBG≅$2^L$, when the NTF is an FIR transfer function. (See, e.g., OBG≅16=$2^4$ point in FIG. 6.)

Figure 7:
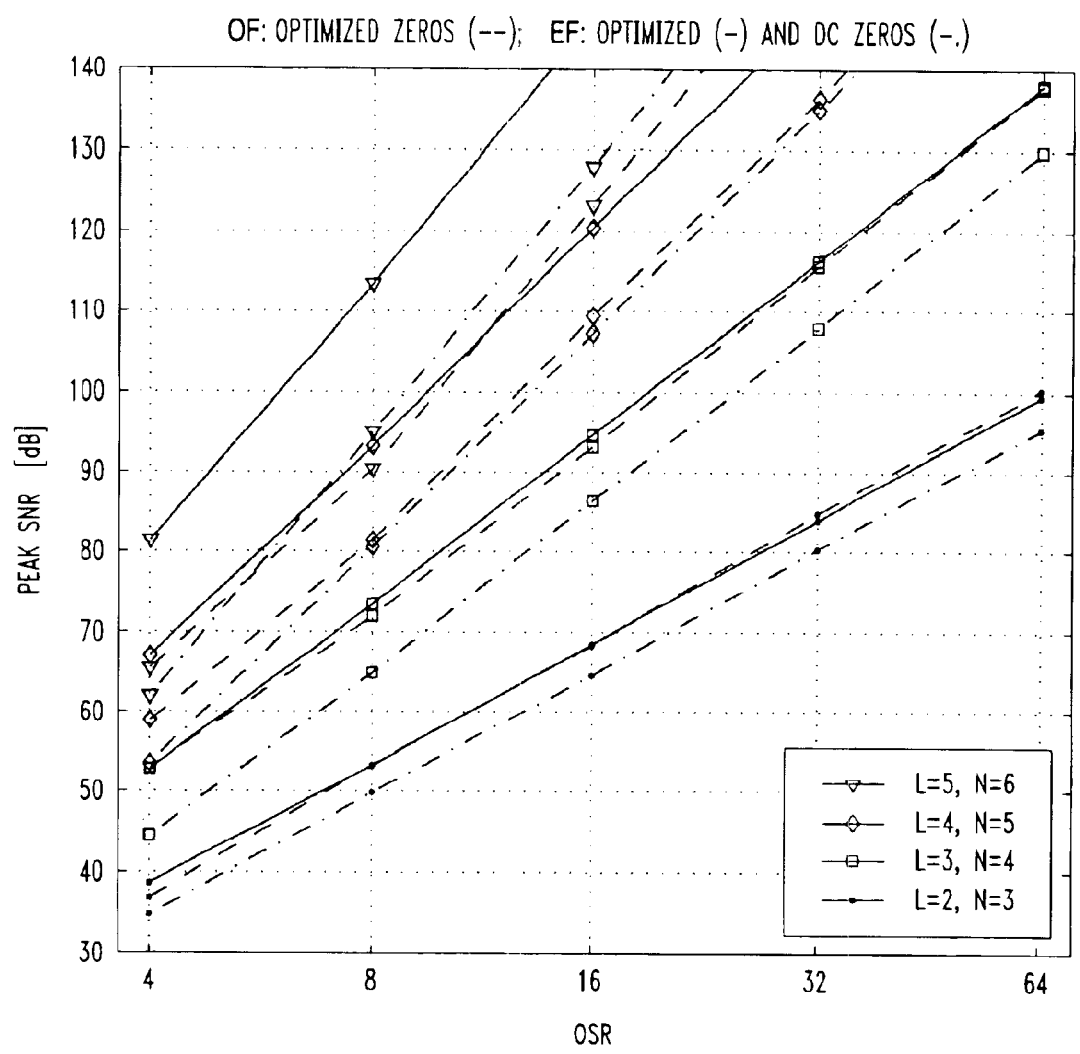
FIG. 7 is a graph illustrating potential performance for various modulators.

The graph of FIG. 7 shows the comparative peak SNR values for EF and OF modulators of various orders with optimized zeros. A DC-zeroed EF modulator with NTF(z)= $(1-z^{-1})^L$ might be attractive, since it can be implemented with simple digital circuitry. Therefore, it was also plotted. However, the simulations indicate that the performance of the DC-zeroed OF modulator is only better than that of an optimized-zeroed DF modulator at higher orders (e.g., L≧5). For L=2, the OF modulator is also stable, so using an EF modulator is not much of an advantage. For L≧3, however, the EF modulator clearly outperforms the OF modulator, since the performance of the OF modulator is limited by the loop's fragile stability.

A coarse quantitative comparison is shown in the Table.

| ΔSNR (dB) | L = 2, N = 3 | L = 3, N = 4 | L = 4, N = 5 | L = 5, N = 6 |
|---|---|---|---|---|
| $EF_{opt}$ vs. $OF_{opt}$ | ±0 | +1 | +10 | +20 |
| $EF_{dc}$ vs. $OF_{opt}$ | −4 | −7 | −2 | +4 |

The Table summarizes the SNR-gain of the optimized-zeroed EF modulator ($EF_{opt}$) versus that of the optimized-zeroed OF modulator ($OF_{opt}$) for L=2 . . . 5 and N=3 . . . 6. The SNR-gain of DC-zeroed EF modulators ($EF_{dc}$) are also shown in FIG. 7 and included in the comparison of the Table. Since ΔSNR varies with OSR, an average rounded value was included in the Table. For example, a $4^{th}$ order 5-bit $EF_{dc}$ modulator lacks only about 2 dB of SNR compared to $OF_{opt}$, but $EF_{dc}$ is significantly simpler to implement than $OF_{opt}$. Again, when a 4th order 5-bit modulator is implemented by $EF_{opt}$ topology, about 10 dB of SNR can be gained over $OF_{opt}$ as shown in the Table. (FIGS. 4, 5 and 7 indicate the "precise" value of ΔSNR=11.9 dB in this case). Due to the affect of nonlinear behavior of the modulators and numerical errors on the results, the given values are approximations. Nonetheless, FIG. 7 and the Table show a dramatic improvement in the SNR by using the $EF_{opt}$ modulators consistent with the present invention.

§ 4.3.2 Experimental ΔΣ EF Modulators

A $4^{th}$ order 5-bit ΔΣ EF DAC prototype, consistent with the present invention, was built from discrete components. This prototype was used to experimentally verify the simulation results related to the stability of the high-order loop and to investigate possible detrimental effects of analog circuit imperfections in the multi-bit DAC.

As shown in FIG. 8, the prototype 800 includes a digital (e.g., sinusoidal) signal generator 810, a ΔΣ EF modulator 820, a scrambler 830, and a DAC (e.g., an analog DAC) 840. The ΔΣ EF modulator 820 has a 24-bit input $x_d$ (provided by the digital sinusoidal generator 810) and a 5-bit output $y_d$. The output $y_d$ is scrambled by scrambler 830 which generates signal $y_s$. The signal $y_s$ is then converted into an analog signal $y_a$ by a 32-element (i.e., 5-bit) DAC 840.

FIG. 9 illustrates a digital implementation 900 of an optimized-zeroed $4^{th}$ order 5-bit EF modulator that may be used as the modulator 820 of FIG. 8. A very low OSR of 4 was used to demonstrate 10-bit accuracy for high-speed applications. Therefore, the loop filter is given by H(z)= $3.4883z^{-1}-5.0071z^{-2}+3.4883z^{-3}-z^{-4}$ (from equation (1) above and using the Matlab ΔΣ toolbox). Expensive multipliers can be avoided since these coefficients can be implemented by shifting and adding/subtracting binary operations. (See, e.g., the shift elements 910 and delay elements 920 of FIG. 9.) For example, the coefficient 3.4883≈4−½− 1/64 and 5.0071≈−4−1. The approximation error of the coefficients is small enough to avoid a significant change of the resulting NTF(z) and only leads to about 0.1 dB SNR penalty. The truncator 930 simply splits bits. The five MSBs constitute the output $y_d$, while the 19-LSB truncation error $-e_t$ is fed back into the loop filter H(z).

To handle the nonlinearities of the multi-bit DAC due to mismatch between its elements, implemented by resistors of 1% tolerance, data-weighted averaging (DWA) (See, e.g., R. T. Baird and T. S. Fiez, "Improved delta-sigma DAC linearity using data weighted averaging," in *Proc. IEEE Int. Symp. Circuits Syst.*, vol. 1, May 1995, pp. 13–16, incorporated by reference and hereafter referred to as "the Baird article".) may be used. Since 10-bit of accuracy was targeted, the first-order mismatch shaping offered by DWA was sufficient. To achieve a higher signal-to-noise-and-distortion ratio (SNDR) when OSR>4, second-order mismatch shaping (See, e.g., Section 8.3 of the Norsworthy text.) can be used.

FIG. 10 is a block diagram of an exemplary DWA scrambler 1000 that may be used as the scrambler 830 in the DAC 800 of FIG. 8. The DWA scrambler 1000 rotates a thermometer-coded word using a barrel shifter (ROT) 1020. A 5-bit register (REG₁) 1040 holds a rotation index which is incremented by the output value of each sample $y_d$. Due to the circular nature of the rotator, the index adder truncates its output to 5 bits. The last register (REG₂) 1030 of the scrambler avoids data-dependent delays in the signal path.

In the system 800 of FIG. 8, various digital logic (e.g., generator 810, modulator 820, and/or scrambler 830) may be implemented using integer arithmetic on an x86 processor. Alternatively, such digital logic may be implemented using a digital signal processor (DSP), and/or a field programmable gate array (FPGA).

Figure 11:
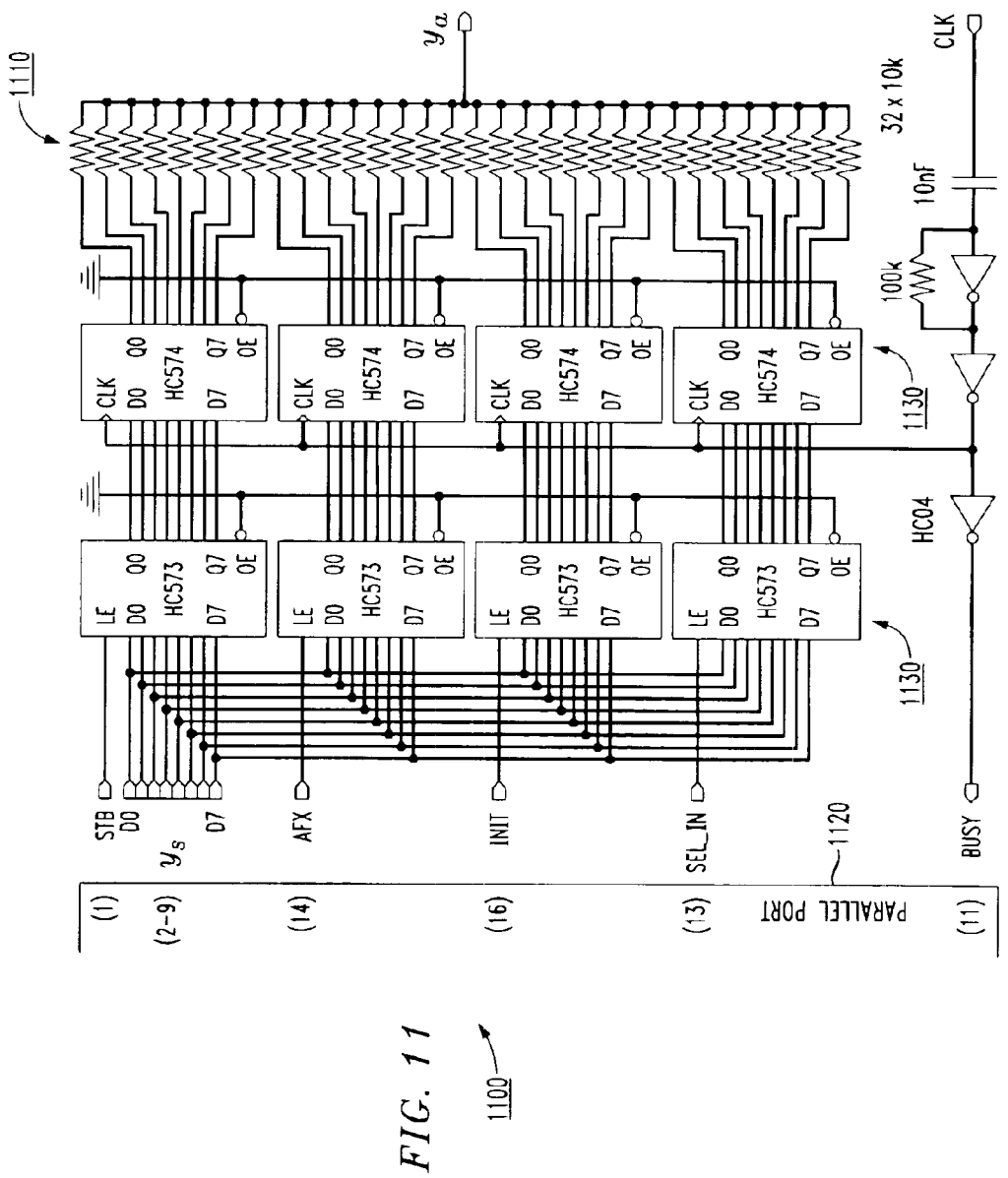
FIG. 11 is a schematic diagram of an exemplary analog DAC that may be used in the experimental $\Delta\Sigma$ EF DAC of FIG. 8.

FIG. 11 illustrates an exemplary (analog) DAC 1100 that may be used as the DAC 840 in the system 800 of FIG. 8. The 32-line thermometer-coded digital output $y_s$ is interfaced with the 32-resistor 1110 "analog" DAC using the parallel port of a personal computer (PC) 1120 and eight 8-bit buffers 1130. The common node of the resistors 1110 provides the analog output $y_a$ Of the ΔΣ DAC. The timing of the circuit is controlled by an accurate external clock (CLK).

The discrete-component experimental setup mimics an integrated IC scenario. (Note that a commercial implementation would likely use integrated circuits rather than chips.) In the experimental prototype, the sampling rate of the DAC was limited to 64 kHz by the parallel port of the PC used in the experiment. To increase the sampling rate, the digital logic is also implemented on a Xilinx Virtex 300 FPGA using A Stream Compiler (ASC) developed at Bell Laboratories. (See, e.g., O. Mencer, M. Platzner, M. Morf, and M. Flynn, "Object-oriented domain-specific compilers for programming FPGAs," *IEEE Trans. VLSI Syst.*, vol. 9, no. 1, pp. 205–210, February 2001, incorporated by reference and hereafter referred to as the "Mencer article".) The maximum clock rate supported by the FPGA card is 100 MHz. Due to the simplicity of the digital logic and the optimizations performed by ASC, a 70 MHz output sampling rate is obtained running on the Xilinx Virtex 300 FPGA.

Experimental results of the prototype $4^{th}$ order 5-bit EF DAC with optimized zeroes described above with reference to FIGS. 8–11 are now described with reference to FIGS. 12a–12c. The effective sampling rate was 64 kHz. The high-order loop remained stable after several hours of operation. The analog output $y_a$ of the multi-bit DAC was captured by a Rohde & Schwarz FSEA spectrum analyzer. The acquired spectra were post processed in a PC to obtain the SNDR values in a 8-kHz (i.e., OSR=4) bandwidth.

FIG. 12(a) shows the in-band output spectrum without using the DWA scrambler 830 (resolution bandwidth (RBW): 30 Hz). Large harmonics and an increased noise floor can be observed, which limit the SNDR to 58.7 dB. As shown in FIG. 12(b), by activating the DWA scrambler 830, the harmonic content becomes negligible and the noise floor is significantly lowered (RBW: 30 Hz). The two NTF(z) minima can be clearly seen. A few small in-band spurious tones are present around the second NTF(z) zero due to idle tones of first-order mismatch shaping. These spurs can be reduced, for example, by using second-order mismatch shaping such as that described in Section 8.3 of the Norsworthy text. A SNDR of 64.1 dB was obtained. This measured value is only 1.8 dB less than the SNR obtained by simulations assuming floating point arithmetic and ideal analog DAC (Recall FIG. 7.). Finally, FIG. 12(c) shows the full 0 . . . 32-kHz $4^{th}$ order noise-shaped spectrum of the DWA-scrambled DAC, but with an increased RBW of 100 Hz.

§ 4.4 Conclusions

High-order ΔΣ EF DACs designed using a sufficient stability criterion consistent with the present invention— which states that an EF modulator with $L^{th}$ order FIR (or perhaps even IIR) noise transfer function and L+1 bits is stable—were found to be robust and achieve better performance than OF architectures. Such ΔΣ EF DACs were able to achieve high resolution even for low oversampling ratios. The present invention eliminates the need of reducing the OBG of the NTF. Like the MASH topology modulators, high-order EF modulators consistent with the present invention are stable and generate high-order noise-shaped, multi-bit output. However, the high-order EF modulators consistent with the present invention may be implemented within a single loop and can be made more hardware efficient and to draw less power than MASH topology modulators.

What is claimed is:

1. Apparatus comprising:
   a) a first signal mixer having a first input for receiving an input signal, a second input, and an output;
   b) a truncation element having an input coupled with the output of the first signal mixer and an output for providing a number of higher order bits defining an output signal;

c) means for providing bits of the output of the first signal mixer, other than those output by the truncation element, as lower order bits, the means for providing including an input coupled with the truncation element, and an output for providing the lower order bits; and d) a noise transfer function element having an input coupled with the output of the means for providing, and an output coupled with the second input of the first signal mixer, wherein the noise transfer function is an L-order transfer function, wherein L is at least 4, and wherein the number of higher order bits is L+1.

2. The apparatus of claim 1 wherein the noise transfer function has a finite impulse response.

3. The apparatus of claim 2 wherein the noise transfer function is a differentiator.

4. The apparatus of claim 2 wherein the noise transfer function is optimized-zeroed.

5. The apparatus of claim 1 further comprising:

e) an analog digital-to-analog converter having an input coupled with the output of the truncation element.

6. The apparatus of claim 1 further comprising:

e) a scrambler having an input coupled with the output of the truncation element.

7. The apparatus of claim 1 wherein L=4.

8. The apparatus of claim 1 wherein L=5.

9. The apparatus of claim 1 wherein the means for providing includes a second signal mixer having a first input coupled with the output of the first signal mixer, a second input coupled with the output of the truncation element, and an output.

10. Apparatus comprising:

a) a first signal mixer having a first input for receiving an input signal, a second input, and an output;

b) a truncation element having an input coupled with the output of the first signal mixer and an output having a number of higher order bits defining an output signal;

c) means for providing bits of the output of the first signal mixer, other than those output by the truncation element, as lower order bits, the means for providing including an input coupled with the truncation element, and an output for providing the lower order bits; and d) a noise transfer function element having an input coupled with the output of the means for providing, and an output coupled with the second input of the first signal mixer, wherein the noise transfer function is an L-order transfer function, wherein L is at least 1, wherein the number of higher order bits is L+1, and wherein a stability of the noise transfer function element is independent of the input signal.

11. The method of claim 10 wherein the out-of-band gain of the noise transfer function element is not limited.

12. The apparatus of claim 10 wherein the noise transfer function has a finite impulse response.

13. The apparatus of claim 12 wherein the noise transfer function is a differentiator.

14. The apparatus of claim 12 wherein the noise transfer function is optimized-zeroed.

15. The apparatus of claim 10 further comprising:

e) an analog digital-to-analog converter having an input coupled with the output of the truncation element.

16. The apparatus of claim 10 further comprising:

e) a scrambler having an input coupled with the output of the truncation element.

17. The apparatus of claim 10 wherein L=4.

18. The apparatus of claim 10 wherein L=5.

19. The apparatus of claim 10 wherein the means for providing includes a second signal mixer having a first input coupled with the output of the first signal mixer, a second input coupled with the output of the truncation element, and an output.

20. A method comprising:

a) accepting an input signal;

b) mixing the input signal with a second signal to generate a third signal;

c) truncating the third signal to generate a number of higher order bits defining an output signal;

d) providing lower order bits of the third signal as a fourth signal; and e) applying the fourth signal to a noise transfer function to generate the second signal, wherein the noise transfer function is an L-order transfer function, wherein L is at least 4, and wherein the number of higher order bits is L+1.

21. The method of claim 20 wherein the noise transfer function has a finite impulse response.

22. The method of claim 21 wherein the noise transfer function is a differentiator noise transfer function.

23. The method of claim 21 wherein the noise transfer function is optimized-zeroed noise transfer function.

24. The method of claim 20 further comprising:

f) converting the output signal to an analog signal.

25. The method of claim 20 wherein L=4.

26. The method of claim 20 wherein L=5.

27. Method comprising:

a) accepting an input signal;

b) mixing the input signal with a second signal to generate a third signal;

c) truncating the third signal to generate a number of higher order bits defining an output signal;

d) providing lower order bits of the third signal as a fourth signal; and e) applying the fourth signal to a noise transfer function to generate the second signal, wherein the noise transfer function is an L-order transfer function, wherein L is at least 1, wherein the number of higher order bits is L+1, and wherein a stability of the noise transfer function element is independent of the input signal.

28. The method of claim 27 wherein the out-of-band gain of the noise transfer function is not limited.

29. The method of claim 27 wherein the noise transfer function has a finite impulse response.

30. The method of claim 29 wherein the noise transfer function is a differentiator noise transfer function.

31. The method of claim 29 wherein the noise transfer function is optimized-zeroed noise transfer function.

32. The method of claim 27 further comprising:

e) converting the output signal to an analog signal.

33. The method of claim 27 wherein L=4.

34. The method of claim 27 wherein L=5.

* * * * *